United States Patent [19]

Nothaft

[11] Patent Number: 4,652,901
[45] Date of Patent: Mar. 24, 1987

[54] INFRARED SENSITIVE SILICON SUBSTRATE WITH INTEGRATED ELECTRONIC PROCESSING DEVICES AND METHOD FOR PRODUCING SAME

[75] Inventor: Peter Nothaft, Gerlenhofen, Fed. Rep. of Germany

[73] Assignee: Licentia Patent-Verwaltungs-GmbH, Frankfurt am Main, Fed. Rep. of Germany

[21] Appl. No.: 346,730

[22] Filed: Oct. 6, 1981

[30] Foreign Application Priority Data

Oct. 15, 1980 [DE] Fed. Rep. of Germany ....... 3038910

[51] Int. Cl.$^4$ ........................................... H01L 27/02
[52] U.S. Cl. ...................................... 357/40; 156/662; 156/901; 156/DIG. 64; 427/82; 427/93; 427/96
[58] Field of Search ............... 156/901, 662, DIG. 64; 357/40; 427/82, 93, 96

[56] References Cited

U.S. PATENT DOCUMENTS

| 4,203,799 | 5/1980 | Sugawara et al. | 156/DIG. 64 |
| 4,357,183 | 11/1982 | Fan et al. | 156/DIG. 64 |
| 4,430,149 | 2/1984 | Berkman | 156/613 |

FOREIGN PATENT DOCUMENTS 0019269  5/1980  European Pat. Off. .

OTHER PUBLICATIONS

K. Nummedal et al., "Extrinsic Silicon Monolithic Focal Plane Array Technology and Applications", Proceedings of the International Conference on the Application of Charge-Coupled Devices, 1975, pp. 19–30.

A. J. Steckl, "Low Temperature Silicon CCD Operation", Proceedings of the 1975 International Conference on the Application of Charge-Coupled Devices, pp. 383–388.

D. M. Erb et al., "Buried Channel Charge-Coupled Devices for Infrared Applications", Proceedings of the CCD Application Conference (Sep. 1973), pp. 157–167.

W. S. Boyle et al., B.S.T.J. Briefs, "Charge-Coupled Semiconductor Devices", Jan. 29th, 1970, pp. 587–593.

Rakesh Kumar et al., "Characterization of Plasma Etching For Semiconductor Applications", Solid State Technology, Oct. 1976, pp. 54–59.

John R. Devaney et al., "Plasma Etching PROMS and Other Problems", Solid State Technology, Dec. 1974, pp. 46–50.

D. E. French, "Use of Charge-Coupled Devices in Infrared Sensor Systems", SPIE vol. 62, Infrared Technology, 1975, pp. 13–25.

Primary Examiner—Stephen J. Lechert, Jr.
Attorney, Agent, or Firm—Spencer & Frank

[57] ABSTRACT

An integrated circuit arrangement including an infrared sensitive silicon substrate having an epitaxial layer with integrated electronic processing devices applied to the major surface thereof, wherein the epitaxial layer is partially etched away to expose the detector region of the substrate. The exposed detector region is then connected to the processing devices by either a shallow diffusion or by other means. A method for producing such an arrangement, preferably using a crystal orientation dependent etching medium for etching the epitaxial layer, is also disclosed.

10 Claims, 6 Drawing Figures

INFRARED SENSITIVE SILICON SUBSTRATE WITH INTEGRATED ELECTRONIC PROCESSING DEVICES AND METHOD FOR PRODUCING SAME

BACKGROUND OF THE INVENTION

The present invention relates to an improved process for producing an integrated circuit arrangement including an infrared sensitive silicon substrate having an epitaxial layer and integrated electronic processing devices applied thereon, and an improved integrated circuit resulting therefrom. Such processes and devices are known in general.

At a given temperature, bodies emit thermal radiation corresponding to Plank's law of radiation with a frequency distribution which is characteristic for the particular temperature. The predominant portion of the radiation lies in the infrared wavelength range. There thus exists the possibility of obtaining a thermal image of the body by detecting its thermal radiation. For this purpose, the thermal radiation emanating from the body must be recorded by a suitable sensor. For practical application, the infrared sensors must be sensitive in one of the atmospheric windows. Practically only the wavelength windows, or ranges, from "$3\mu$ to $5\mu$" and from "$8\mu$ to $14\mu$" are applicable for the thermal image technique and various detectors which operate in these wavelengths ranges exist.

One class of thermal detectors operating in the above wavelength ranges includes, for example, PbSe, PbTe or CdHgTe compounds. However, due to almost unavoidable inhomogeneities in the composition of the material of these detectors, they exhibit great fluctuations in sensitivity even among themselves so that, for recording the thermal or temperature distribution of a body, almost exclusively only a single infrared sensitive sensor of this type can be employed in practice. Moreover, in order to compose an image, the body is scanned by means of a system of mirrors and lenses, the radiation is focused on the detector, and the photocurrent of the detector is a measure for the adsorbed light energy. For this purpose, the detector must be cooled so that its own thermal noise as well as the electronic noise in the detector system lies sufficently below the actual signal. To obtain fast image composition, it is desirable to arrange a plurality of detectors in a row to form a detector array. In this way, it is not necessary to scan the body in one dimension. A matrix arrangement, in addition to even faster image composition, would provide the additional advantage that no movable mirrors are required. However, in that case the detector homogeneity must be very high which, as already mentioned, cannot be realized with the above materials.

More promising than the above-discussed detectors seem to be detectors made of silicon material provided with suitable doping substances to enable them to detect infrared radiation. Such doping elements are, depending on the required wavelength range, gallium, indium, thallium, tellurium and the like. Such detectors have been operated with success both individually and in rows. Moreover, K. Numedal and coworkers (Huges Aircraft Company, Culver City, Calif. 90230) presented a matrix arrangement of infrared sensitive detectors on extrinsic silicon ("Proceedings of the International Conference on the Application of Charge-Coupled Devices"). These applications as well require sufficient detector homogeneity.

Inhomogeneities originate in silicon from the radially outward diffusion of doping atoms during the cooling phase when silicon crystals are drawn out of the melt. However, with the use of sufficiently high pressures during crystal drawing, this redistribution can be prevented. Moreover, a remainder of boron atoms, which is unavoidable in silicon, can be compensated with a corresponding concentration of phosphorus atoms. Such additional phosphorus doping can be accomplished relatively easily by way of irradiating the infrared sensitive silicon with thermal neutrons. After neutrons capture of silicon nuclei, the silison isotope, which has a known thermal cross section and is unstable with respect to beta decay, yields a phosphorus nucleus.

Compared to the above-mentioned infrared sensors, the detectors on a silicon basis have the decisive advantage that they can be integrated relatively easily with the necessary electronic devices for signal processing. A plurality of methods known from the semiconductor art can be used for this purpose.

However, infrared sensitive silicon substrates and the silicon materials employed in semiconductor electronics have such different properties that the integration of infrared (IR) detectors with the associated electronic signal processing devices is only conditionally possible on extrinsic silicon. This problem is circumvented in that a silicon epitaxial layer of suitable thickness and doping is applied to the photosensitive silicon starting material or substrate. In that case, the electronic signal processing then takes place in the MOS (or possibly also in the bipolar) technique, while employing charge coupled devices (CCD). The novel problem is now to establish electrical contact between the IR photoconductor and the electronic signal processing devices.

According to the prior art, the electrical connection between the IR photoconductor substrate and the integrated electronic signal processing devices is realized by means of a diffusion (annular) through the epitaxial layer into the photosensitive substrate. Under certain circumstances, it is necessary to effect an additional diffusion of low penetration depth between the contact diffusion for the IR detector and the initial diffusion for signal processing so as to assure this connection even for spatially far separated components (detectors, electronic circuitry).

Because of this contact diffusion, the geometric fixing of the detector range poses problems. Moreover, in practical operation, part of the photons impinging in the direction of the detector is already absorbed in the epitaxial layer before reaching the actual detector region and thus is lost as a contribution to the photocurrent.

A further, even more significant difficulty of this diffusion technique of detector connection to the electronic devices is the undesirable redistribution of the doping atoms. That is, the doping atoms used for the detection of light in the infrared wavelength range have relatively high diffusion coefficients so that a redistribution of the doping substances results during the high temperature steps inherent in the above-mentioned diffusion process, with this redistribution of the doping substances being considerable under certain circumstances. Particularly in the above discussed connection diffusion, with the relatively long diffusion time and the high temperature at which the diffusion takes place, this redistribution may have a particularly disadvantageous effect. In particular, doping atoms from the substrate diffuse into the oppositely doped epitaxial layer, while simultaneously the doping of the upper layers of the infrared sensitive extrinsic silicon substrate is changed by doping atoms from the epitaxial layer. This adversely affects the quality of the epitaxial layer and consequently also its electrical properties. Under certain circumstances, the redistribution of the doping atoms may even cause an electrical short circuit between the detector region and the electronic signal processing devices. Thus the contact diffusion constitutes a significant problem for the later operation of IR sensor elements and their associated signal processing devices on a single chip.

As can be seen from the above discussion, the required epitaxial layer thickness for a device of the type described above is determined by two contradictory requirements: on the one hand, the epitaxial layer should be sufficiently thin to assure absorption and thus detection of IR photons in the actual detector zone, i.e. the substrate, while on the other hand, no short-circuit must form between the epitaxial layer and the subtrate at the voltages occurring in CCD operation and in the resulting space charge zones underneath the individual electrodes. In the prior art, the thickness of the epitaxial layer is about 10μ. Such a device is disclosed, e.g., in an article by A. J. Steckl, "Low Temperature Silicon CCD Operation", Proceedings of the 1975 International Conference on the Application of Charge-Coupled Devices, pp. 383–388 and in an article by D. M. Erb, K. Nummendal, "Buried Channel Charge-Coupled Devices for Infrared Applications", Proceedings of the CCD Application Conference (Sept. 1973), pp. 157–167.

SUMMARY OF THE INVENTION

It is therefore the object of the present invention to provide a process of producing a device of the above-mentioned type which avoids the above-listed drawbacks of contact diffusion and an improved device resulting from this process.

This is accomplished according to the present invention in that in a method of producing an integrated circuit arrangement including the steps of: depositing an epitaxial layer of silicon of one conductivity type on the surface of an infrared sensitive silicon substrate of the opposite conductivity type, forming integrated semiconductor electronic signal processing devices on a portion of the surface of the epitaxial layer, and providing an electrical connection between a desired detector region of the substrate and the electronic processing devices; the portion of the epitaxial layer over the desired detector region is etched away to expose the desired detector region of the substrate prior to the step of providing an electrical contact.

According to other features of the method according to the invention, a crystal orientation dependent etching medium, for example, ethylene diamine, or a plasma or ion jet etching process is employed to etch away the epitaxial layer. Moreover, the electrical connection between the exposed detector region and the electronic processing devices may be formed by a shallow diffused region or by a deposited doped polycrystalline silicon or aluminum connecting path. Preferably, a matrix or row of exposed and connected desired detector regions is formed by the method of the invention.

The above object is further achieved in that in an integrated circuit arrangement including: an infrared sensitive silicon substrate of one conductivity type having a silicon epitaxial layer of the opposite conductivity type on a major surface of same, integrated semiconductor electronic signal processing devices formed on a portion of the outer surface of the epitaxial layer, and means for electrically connecting a desired detector region on the major surface of the substrate to the electronic signal processing devices; an opening is provided thorugh the epitaxial layer over the desired detector region to expose same, and the means for electrically connecting comprises a conductive path extending from the exposed detector region along the surface of the epitaxial layer to the signal processing devices.

Preferably, the epitaxial layer is approximately 5μ thick, and the means for electrically connecting comprises a shallow diffused reigon, of the same conductivity type as the substrate, formed in the exposed portion of the detector region and the surface of the epitaxial layer The exposure of the detector region by etching is included at a suitable point in the manufacturing process. In this connection, anisotropy as well as doping dependent etching of silicon with, for example, ethylene diamine (or other crystal oriented etching solutions) in various crystal orientations can be utilized. The etching rate of ethylene diamine is dependent on the concentration of doping substances in the silicon. Since the etching rate is reduced practically to zero at the junction with a p+ layer, ethylene diamine is excellently suited for etching the detector windows out of an n doped epitaxial layer. During transition to the IR sensitive substrate (p conductive), the etching rate is thus greatly reduced. For this purpose, the starting material is (1, 0, 0) silicon on which the part of the epitaxied silicon layer which is not relevant optically for detector operation is masked with silicon dioxide. During the photolithographic process, the edges of the rectangular detector are oriented to be parallel or perpendicular, respectively, to the flat. After etching of the silicon dioxide in the detector region, ethylene diamine is used (for example) to etch away at increased temperature the silicon epitaxial layer down to the substrate and expose same. Since ethylene diamine only insignificantly attacks the (1, 1, 1) plane compared to the other silicon crystal planes, a trough shape is formed when etching rectangular structures in the (1, 0, 0) starting material, due to the preferred (1, 0, 0) etching direction. The slope angle is about 55°. The electrical connection of the thus exposed detector region with the signal processing devices is effected after the desired detector region window or opening has been opened in the epitaxial layer, e.g. by means of a shallow diffusion in the detector window and at the input for the signal processing devices. Since the temperature stresses on the doping atoms involved in a prior art "p+ deep contact diffusion" are eliminated, the thickness of the epitaxial layer can be reduced to about 5μ in the device according to the invention.

Instead of the just discussed "shallow" connection diffusion between the exposed detector region and the signal processing devices, the detector region can also be contacted via a polycrystalline silicon electrode or via aluminum connecting paths.

If the "dual layer polysilicon technique" is used, the detector can be contacted, after etching of the trough to expose the desired detector region, by means of polycrystalline silicon. The use of polycrystalline silicon from the second plane is of advantage for this electrode. The second layer of polycrystalline silicone is deposited without doping, but subsequently it is doped together with the drain-source diffusions in the MOS technique. Such a dual layer technique is disclosed by W. S. Boyle, G. E. Smith in "Charge Coupled Semiconductor Devices", The Bell System Technical Journal, 49, April 1970, pp. 587–593.

DETAILED DESCRIPTION OF THE PREFERRED EMBODIMENT

Figure 1:
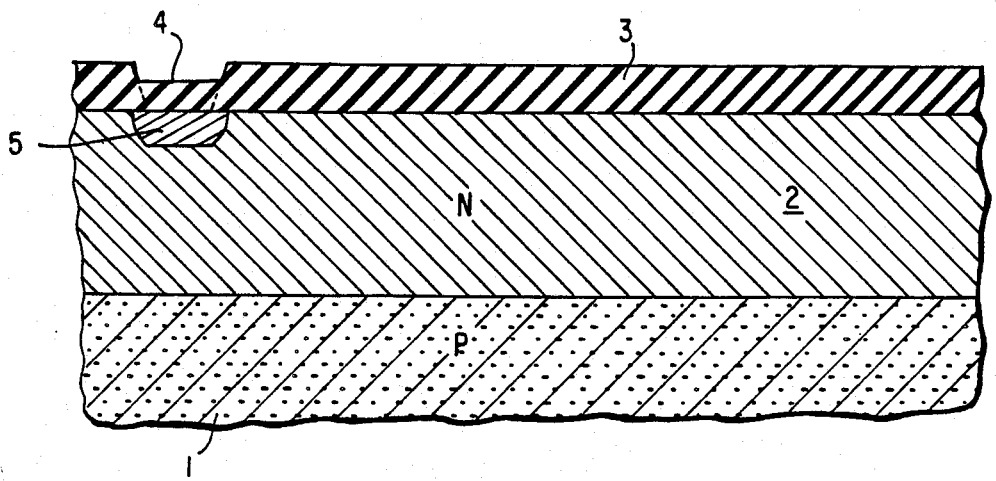
FIGS. 1 through 4 are schematic representations of the process sequence according to a preferred embodiment of the process according to the inventin.

Turning now to FIG. 1, there is shown a p conductive infrared sensitive silicon substrate or starting material 1 (preferably Si:In, Si:Ga respectively with a concentration of typically $\geq 10^{17}$ cm$^{-3}$), having an n doped layer 2, of a thickness of approximately 5$\mu$, epitaxially deposited on a major surface of same. The concentration of the epitaxial layer is about $10^{15}$ cm$^{-3}$ phosphorus and corresponds to the standard p-channel CCD-process. Thereafter, the substrate 1 and the layer 2 are subjected to an oxidizing atmosphere to cause the field oxide layer 3 of SiO$_2$ to be grown (typically 1 $\mu$m). To provide for the later required electrical contacting of the epitaxial layer 2, diffusion windows 4 are opened in the oxide layer 3 in a conventional manner. Thereafter, via windows 4, an n-type dopant is diffused into the surface of the layer 2 to form the n$^+$ region 5, and then these windows 4 are oxidized shut.

Figure 2:
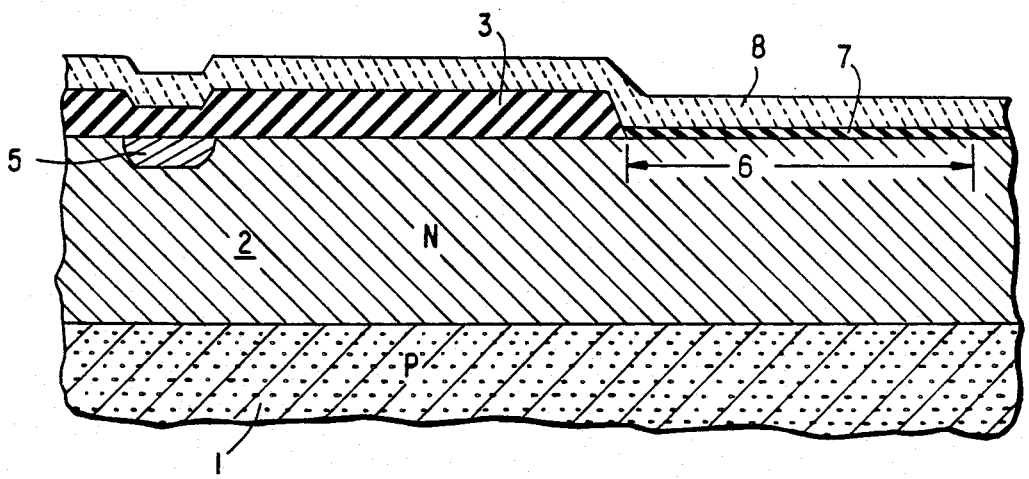

Thereafter, as shown in FIG. 2, the active regions 6 of the layer 2, on which the electronic processing devices are to be built up, are exposed by etching away the overlying portion of the oxide layer 3, and are then covered with a new thin oxide layer 7. After formation of this oxide layer 7 over the active regions 6, which oxide layer 7 will serve as a gate oxide ($d_{ox} \approx 130$ nm) for the MOS devices, a boron doped, polycrystalline silicon layer 8 is deposited with a thickness of 500 nm over the outer surface of the oxide layers 3 and 7.

Figure 3:
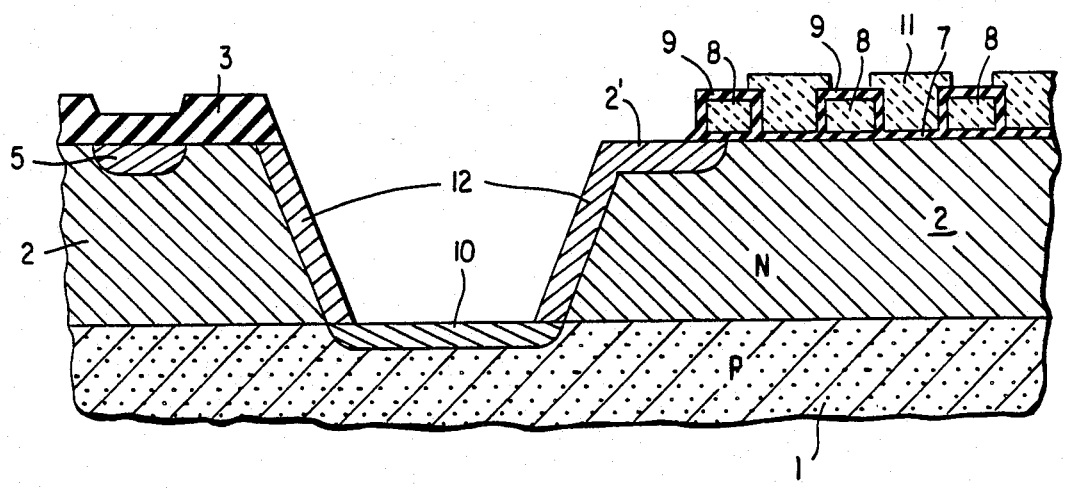

As shown in FIG. 3, this first polysilicon plane, i.e. layer 8, after having been structured in a known manner is then oxidized so as to cover same with an oxide layer 9 ($d_{ox} \approx 130$ nm). Thereafter, the desired detector regions 10 of the surface of the substrate 1 are exposed by forming overlapping windows or openings in the epitaxial layer 2 by means of a conventional photoprocess and a subsequent etching process. In addition to the field oxide layer 3, the last grown oxide layer 8 serves as a mask for the etching medium which, as described above, is preferably a crystal orientation dependent silicon etching medium. Preferably, as further mentioned above, the p type conductivity substrate is (1, 0, 0) silicon and the etching medium used is, e.g., ethylene diamine. Thereafter, the second polycrystalline silicon plane or layer 11 is deposited without doping onto the oxide masking layer 9 and subsequently structured in a conventional manner to provide a structure as shown. The oxide layer 3 on the portions 2' of the surface of the epitaxial layer 2 leading to the signal input of the electronic processing devices 7-11 is then removed using a masking and oxide etching process and the exposed surface portion of the substrate 1 in the detector region 10, as well as the exposed side surfaces of the epitaxial layer 2 adjacent the detector region 10, the surface portion 2' and the polycrystalline silicon layer 11, are subjected to a boron diffusion simultaneously with the diffusion of the drain/source areas of the transistors in the preamplifier stage at the CCD-output. This boron diffusion not only dopes the layer 11 but moreover forms the shallow diffused regions, or path, 12 in the side surfaces of the layer 2, the detector region 10 of the substrate 1 and the surface portion 2' so as to electrically connect the detector region 10 to the input of the electronic signal processing devices. During this process step, the diffusion of the rear contact region (not shown) for the substrate 1 also takes place.

Figure 4:
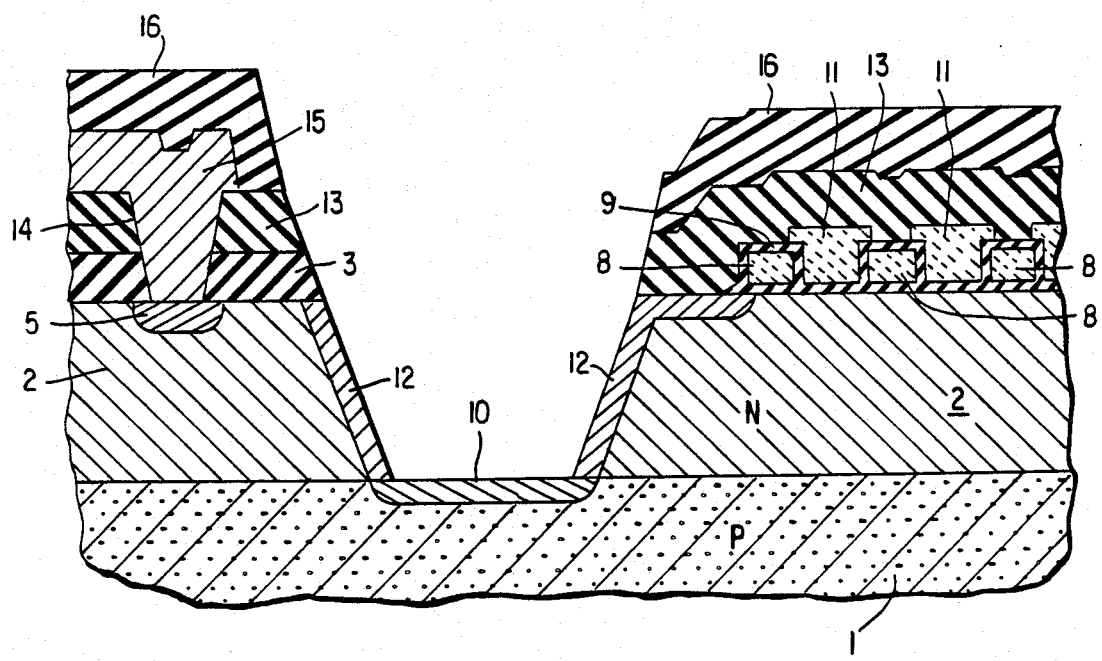

The entire outer surface of the device is then covered with a deposited intermediate oxide layer 12 (FIG. 4)—typically 1$\mu$, and then contact windows, as shown, e.g., at 14, are etched through the layer 13 for contacting the n-doped epitaxial layers, detectors and signal processing components. After vapor-deposition of a metal layer 15 of, for example, aluminum and conventional structuring of the aluminum layer 15 into the desired conductive paths, a covering oxide layer 16 (oxide thickness $\approx 1\mu$) is deposited. The technological process sequence is then concluded by opening windows (not shown) in the oxide layer 16 to expose the connecting pads on the metal layer 15 and by removing the oxide layers and metal from the detector region 10 to again expose same as shown in FIG. 4.

It is understood that the present invention can be employed not only for the semiconductor technology and the silicon materials described in connection with the preferred embodiment. Instead of the (1, 0, 0) silicon starting material, other silicon crystal orientations are possible for which there exist corresponding etching solutions and etching processes. Likewise, the doping may be complementary to that described. Moreover, instead of using a selective etching medium, other etching processes, for example a plasma or ion jet process, can be adopted from the standard semiconductor technology and may be used to etch the layer 2 and expose the region 10. Plasma or ion jet etching processes are distributed by R. Kumar, C. Ladas, G. Hudson in "Characterization of Plasma Etching For Semiconductor Applications" Solid State Technology, Oct. 1976, pp. 54–59 and by J. R. Devaney, A. M. Sheble in "Plasma Etching PROMS and other Problems" Solid State Technology, Dec. 1974, pp. 46–50.

Figure 5:
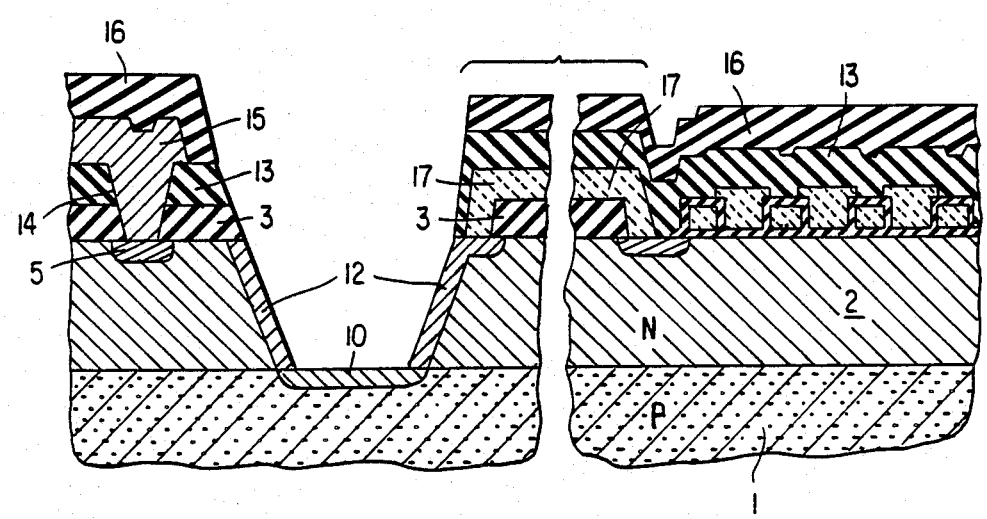
FIG. 5 is a cross-sectional view similar to FIG. 4 but showing a modification of the invention.
Figure 6:
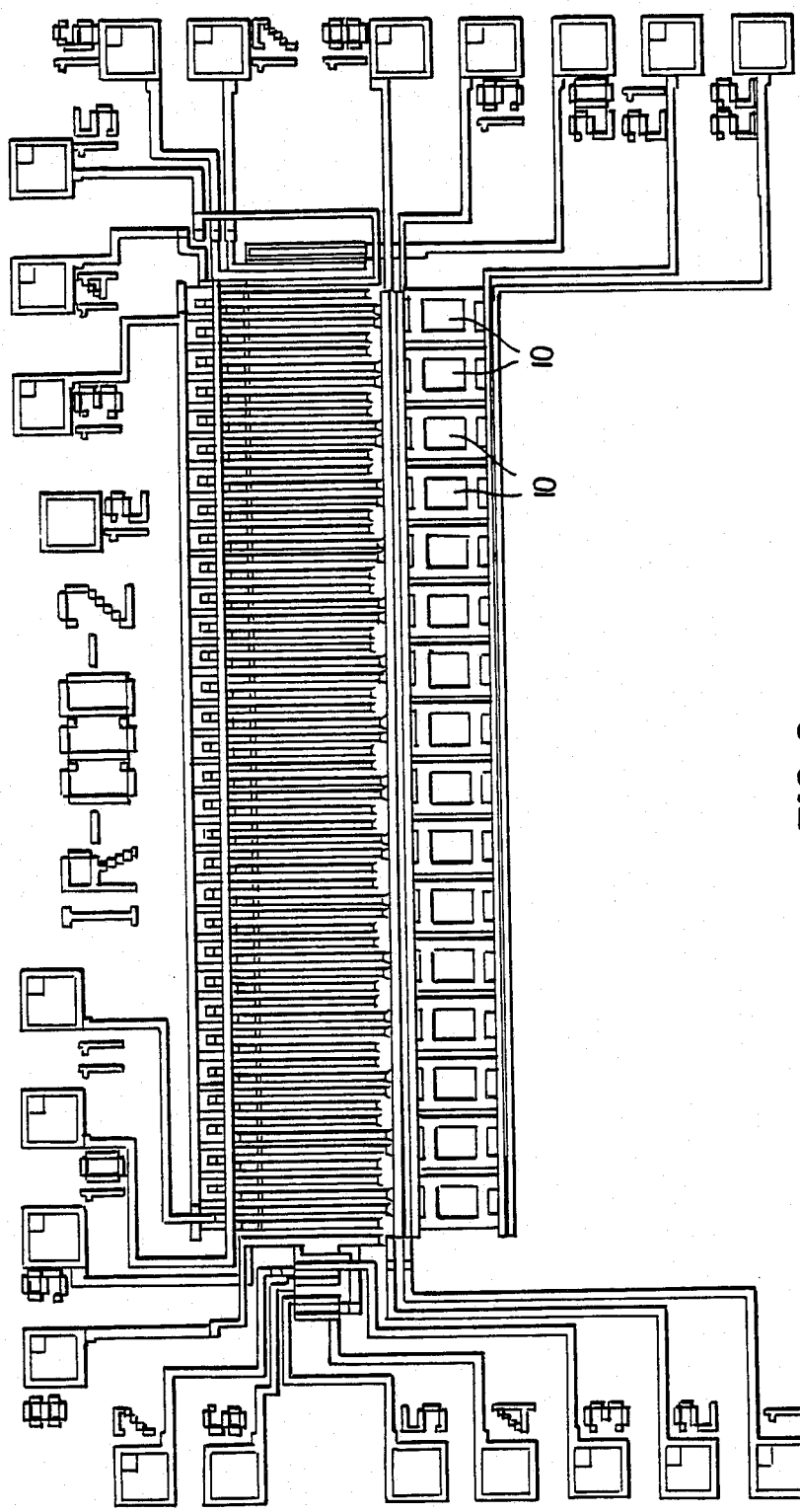
FIG. 6 is a plan view of an embodiment of the invention with a linear array of detector elements.

The detector regions 10 and the associated electronic processing devices 7-11 may, of course, also be arranged on the chip in spatial separation, in which case they would have to be linked together by means of conductive paths. Such paths could, for example, be formed by conductive paths of doped polycrystalline silicon or of aluminum. In FIG. 5 these paths are represented by path 17. Between the separated detector and CCD-regions preferably signal - preprocessing like background subtraction or skimming, may be provided (i.e. see Publication No. 0 019 269 A1 of the European Patent Office, dated Nov. 26, 1980, or the article by D. E. French, "Use of Charge Coupled Devices in Infrared Sensor Systems" SPIE, Vol. 62 (1975) Infrared Technology, pp. 13–25 FIG. 6 illustrates an embodiment of the invention and shows a plan view of a linear array which consists of several detector elements 10. The information locally distributed in the row of detector elements 10 is transferred after a predetermined integration time under the polycrystalline silicon layers 8 and 11, respectively. In this way, the parallel-serial conversion is effected.

It will be understood that the above description of the present invention is susceptible to various modifications, changes and adaptations and the same are intended to be comprehended within the meaning and range of equivalents of the appended claims.

What is claimed is:

1. In a method of producing an integrated circuit arrangement including the steps of depositing an epitaxial layer of silicon of one conductivity type on the surface of an infrared sensitive silicon substrate of the opposite conductivity type, forming integrated semiconductor electronic signal processing devices on a portion of the surface of said epitaxial layer, and providing an electrical connection between a desired detector region of the substrate and the electronic processing devices; the improvement further comprising the step of: prior to said step of providing an electrical contact, etching away the epitaxial layer over said desired detector region to expose said desired detector region of said substrate.

2. The method defined in claim 1 wherein said step of etching includes utilizing a crystal orientation dependent etching medium for etching said epitaxial layer.

3. The method defined in claim 2 wherein said etching medium is ethylene diamine.

4. The method defined in claim 1 wherein said step of etching inlcudes employing a plasma or ion jet etching process to etch away the eptiaxial layer.

5. The method defined in claim 1 wherein said step of providing an electrical connection includes forming a shallow diffused regionof said opposite conductivity type in the exposed detector region of the semiconductor substrate and in a portion of the surface of said epitaxial layer extending from said exposed detector region to the electronic processing devices.

6. The method defined in claim 1 wherein said step of providing an electrical connection includes depositing a doped polycrystalline silicon or aluminum connecting path between the exposed detector region and the electronic processing devices.

7. The method defined in claim 1 wherein said substrate includes a plurality of said desired detector regions arranged in a row; said step of etching includes etching said epitaxial layer to expose each of said desired detector regions; and said step of providing an electrical connection includes connecting each of said exposed desired detector regions to said processing devices.

8. In an integrated circuit arrangement including an infrared sensitive silicon substrate of one conductivity type having a silicon epitaxial layer of the opposite conductivity type on a major surface of same, integrated semiconductor electronic signal processing devices formed on a portion of the outer surface of said eptiaxial alyer, and means for electrically connecting a desired detector region on said major surface of said substrate to said electronic signal processing devices; the improvement wherein: an opening is provided through said epitaxial alyer over said desired detector region to expose same; and said means for electrically connecting comprises a conductive path extending from said exposed detector region along the surface of said epitaxial layer to said signal processing devices.

9. An integrated circuit arrangement as defined in claim 8 wherein said epitaxial layer is approximately $5\mu$ thick.

10. An integrated circuit arrangement as defined in claim 8 wherein said means for electrically connecting comprises a shallow diffused region of said one conductivity type formed in the exposed portion of said detector region and the surface of said epitaxial layer.

* * * * *